United States Patent

Wei

[11] Patent Number: 6,037,208
[45] Date of Patent: Mar. 14, 2000

[54] METHOD FOR FORMING A DEEP TRENCH CAPACITOR OF A DRAM CELL

[75] Inventor: Houng-Chi Wei, I-Lan, Taiwan

[73] Assignee: Mosel Vitelic Inc., Hsinchu, Taiwan

[21] Appl. No.: 09/298,868

[22] Filed: Apr. 26, 1999

[30] Foreign Application Priority Data

Apr. 20, 1999 [CN] China ................................ 88106313

[51] Int. Cl.$^7$ .................................................. H01L 21/336
[52] U.S. Cl. ............................................ 438/243; 438/227
[58] Field of Search ..................................... 438/243, 386, 438/244, 247, 248, 246, 245, 257, 301, 424, 227

[56] References Cited

U.S. PATENT DOCUMENTS

| | | | |
|---|---|---|---|
| 4,921,816 | 5/1990 | Ino | 437/52 |
| 5,620,912 | 4/1997 | Hwang | 438/301 |
| 5,654,218 | 8/1997 | Lee | 437/301 |
| 5,656,535 | 8/1997 | Ho et al. | 438/386 |
| 5,712,185 | 1/1998 | Tsai et al. | 437/67 |

*Primary Examiner*—Tom Thomas
*Assistant Examiner*—Belur V. Keshavan
*Attorney, Agent, or Firm*—Harold L. Novick; Nath & Associates

[57] ABSTRACT

A method of forming a trench capacitor over a semiconductor substrate comprises the following steps. First, a nitride layer is formed on the substrate. Then, a first oxide layer is formed on the nitride layer. Next, the first oxide layer and the nitride layer are etched to expose a portion of the surface of the substrate. An etching back step is performed to etch the nitride layer to pull back the sidewalls of the nitride layer. Next, the second oxide layer is formed above the first oxide layer, the nitride layer and the substrate. An etching step is done to form the trench structure on the substrate by using the first oxide layer as a mask. Then, a wet etching step is performed to remove the first oxide layer and the second oxide layer. Next, a doping step is done to form the doped region in the trench structure. A dielectric layer is then formed above the doped region. A conducting layer is formed on the dielectric layer, wherein the conducting layer is coupled with a drain.

20 Claims, 6 Drawing Sheets

6,037,208

METHOD FOR FORMING A DEEP TRENCH CAPACITOR OF A DRAM CELL

FIELD OF THE INVENTION

The present invention relates to a process for manufacturing a deep trench for a Dynamic Random Access Memory (DRAM) cell, and more specifically, to a process for manufacturing a trench structure.

BACKGROUND OF THE INVENTION

With the coming of Ultra Large Scale Integrated (ULSI) DRAM devices, the sizes of memory cells have gotten smaller than micrometer such that the area available for a single memory cell has become very small. This causes reduction in capacitor area, resulting in the reduction of cell capacitance. Accordingly, for the memory cells in DRAM devices, the most important issue currently is how to promote the storage ability and operation stability of capacitors when the scales of devices still decreases and the integration increases. Thus, the susceptibility of capacitors due to at particle radiation and soft errors is lowered, and the increasing refresh frequency is improved.

For solving the issues above, the prior art approaches to overcome these problems have resulted in the development of the various types of capacitors, such as the trench capacitor and the stacked capacitor. However, The manufacture of the stacked capacitor causes difficulties due to the limitation of the lithography technique. Besides, enormous stacked structures for promoting storage capacity usually cause the crack of the stacked structure occurring due to the unequally stress. On the other hand, the storing capacity of trench capacitor can not be promoted effectively due to the scale of trench capacitor is restricted.

Refer to FIG. 1, the typical process for manufacturing a trench capacitor is shown, wherein a nitride layer 4 is formed on a substrate 2 firstly to be a stopper in latter steps. Then, a thick oxide layer 6 is formed on the nitride layer 4 to serve as an etching mask in latter etching step for forming the trench structure. Next, opens are formed on the oxide layer 6 and nitride layer 4 to expose the top surfaces of the substrate 2 and to define the pattern of the trenches. Subsequently, as illustrated in FIG. 2, an etching step is performed to etch the substrate 2 to form the trench structures 10 by using the oxide layer 6 as a mask. It is noted that much time is needed to etch the substrate 2 for forming the deep trench structures 10, and causes the oxide layer 6 suffering erosion in the etching step. Especially, the facets 12 usually occur on the sidewalls of the oxide layer 6, as shown in FIG. 2.

Refer to FIG. 3, after the trench structures 10 are formed, an etching back step is performed to etch the nitride layer 4 to pull-back the sidewalls 14 of the nitride layer 4. Thus, the conducting layer can be filled effectively into the trench structures 10 smoothly and completely. In general, the cycle time of etching the substrate 2 is elongated to form the deeper trench structures 10 for promoting the surfaces of the trench capacitors effectively. However, the oxide layer 6 as an etching mask always suffers severe damage. As illustrated in FIG. 4, the surface of the substrate 2 is exposed due to the nitride layer 4 suffered erosion after the oxide layer undergone the severe corrosion. It is noted that the contaminated particles, such as black silicon, occur on the surface of the substrate 2 when the nitride layer 4 is eroded. Accordingly, the yield of the trench capacitors produced in latter steps becomes lower and the dimensions of the trench structures become uncontrollable. In conventional technique, for solving the issues above, the cycle time to form the trench structures is lowered to prevent the nitride layer 4 from eroding. However, the depths of the capacitors are restricted due to the limited time, cause the reduction of the capacitor surfaces, and cause the descent of storage capacity. Further, even the cycle time of etching is limited, the nitride layer 4 on the periphery area of the wafer still eroded due to the loading effect. Namely, the nitride layer 4 above the periphery area of the wafer are eroded before the depths of the trench structures are etched to the predetermined values.

SUMMARY OF THE INVENTION

The prime objective of the present invention is to provide a method for forming a trench structure.

The second objective of the present invention is to provide a method for decreasing the probability of the contaminated particles occurring on the substrate in manufacturing the deep trench capacitor.

The further objective of the present invention is to prevent the nitride layer from erosion in forming the trench structure.

A method of forming a trench capacitor for a DRAM cell over a semiconductor substrate comprises the following steps. First, a nitride layer is formed on the substrate. Then, the first oxide layer is formed on the nitride layer to be an etching mask. Next, the first oxide layer and the nitride layer are etched to expose a portion of the surface of the substrate for defining the trench structure. An etching back step is performed to etch the nitride layer by using the oxide layer as an etching mask to pull back the sidewalls of the nitride layer. Next, the second oxide layer is formed above the first oxide layer, the nitride layer and the substrate. An etching oxide layer is done to form the trench structure on the substrate by using the first oxide layer as a mask, wherein the trench structure has a bottom and sidewalls adjacent to the bottom. Then, a wet etching step is performed to remove the first oxide layer and the second oxide layer. Next, a doping step is done to form the doped region in the trench structure. Subsequently, a dielectric layer is formed above the doped region. A conducting layer is formed on the dielectric layer, wherein the conducting layer is coupled with a drain.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method is disclosed hereinafter to prevent the nitride layer suffering erosion and the contaminated particles occurring on the surface of the substrate, by pulling back the sidewalls of the nitride layer firstly and forming a sacrificial layer to cover the sidewalls of the nitride layer. Accordingly, the cycle time of etching the substrate is elongated effectively to form the deeper trench structures for increasing the surface of the capacitor. In addition, the integration of the integrated circuit is promoted due to the dimensions of the trench structures are controlled precisely. Thus, the performance, storage capacity and yield of the capacitor are all promoted. The detailed description is as follows.

Figure 1:
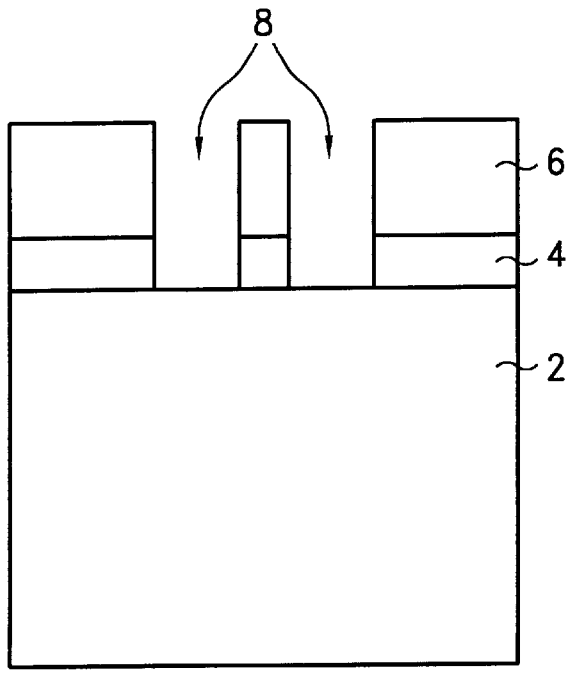
FIG. 1 is a cross sectional view of a semiconductor wafer illustrating the steps of forming the nitride layer and the oxide layer on the substrate in accordance with the prior art.
Figure 2:
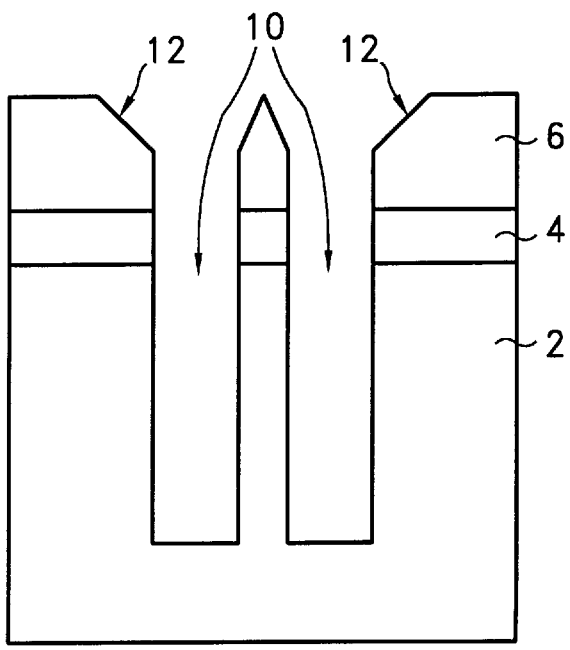
FIG. 2 is a cross sectional view of a semiconductor wafer illustrating the steps of forming the trench structures on the substrate in accordance with the prior art.
Figure 3:
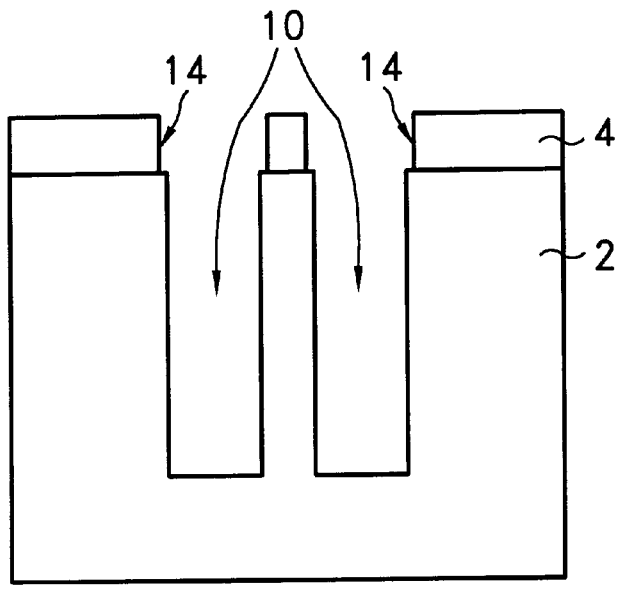
FIG. 3 is a cross sectional view of a semiconductor wafer illustrating the steps of pulling back the sidewalls of the nitride layer in accordance with the prior art.
Figure 4:
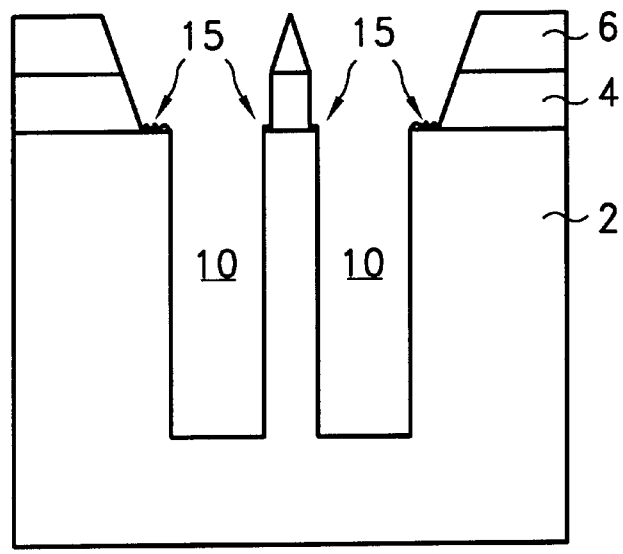
FIG. 4 is a cross sectional view of a semiconductor wafer illustrating the erosion of nitride layer in the step of forming the trench structures in accordance with the prior art.
Figure 5:
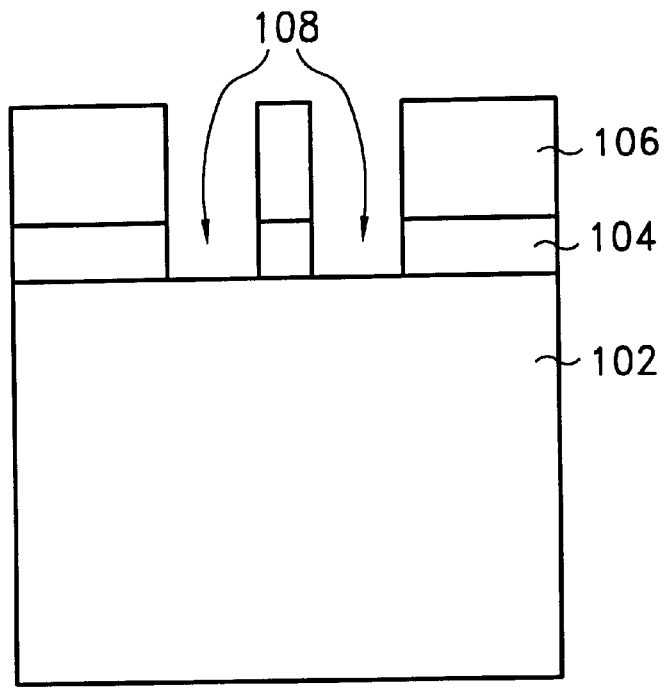
FIG. 5 is a cross sectional view of a semiconductor wafer illustrating the steps of forming a nitride layer and an oxide layer on the substrate in accordance with the present invention.

Refer to FIG. 5, in the preferred embodiment, a silicon substrate 102 is provided with <100> crystallographic orientation. In general, various semiconducting materials, such as gallium arsenide, germanium or silicon on insulator (SOI) can be chosen to serve as the substrate 102. Besides, any other suitable orientation such as <110> or <111> is useful due to the surface property is not critical in the present invention. Then, a nitride layer 104 is formed on the substrate 102. In a preferred embodiment, the nitride layer 104 can be formed using Low Pressure Chemical Vapor Deposition (LPCVD), Plasma Enhance Chemical Vapor Deposition (PECVD), and so on. Further, the temperature forming the nitride layer 104 is at a range of 400–800° C. In the preferred embodiment, the reaction gases of the step to form nitride layer are $SiH_4$, $NH_3$, $N_2$, $N_2O$ or $SiH_2Cl_2$, $NH_3$, $N_2$, $N_2O$.

Then, a thick oxide layer 106 is formed on the nitride layer 104 to be an etching mask in latter steps. In a preferred embodiment, the oxide layer 106 with a thickness about 5000 to 8000 angstroms can be formed by using chemical vapor deposition (CVD) process, using TEOS as a source at a temperature between about 600 to 800° C., at a pressure 0.1 to 10 torrs. Next, the oxide layer 106 and the nitride layer 104 are etched in sequence to form opens 108 on the oxide layer 106 and the nitride layer 104, and to expose the surface of the substrate 102, wherein the openings 108 are used to define the trench structures formed in latter steps.

Figure 6:
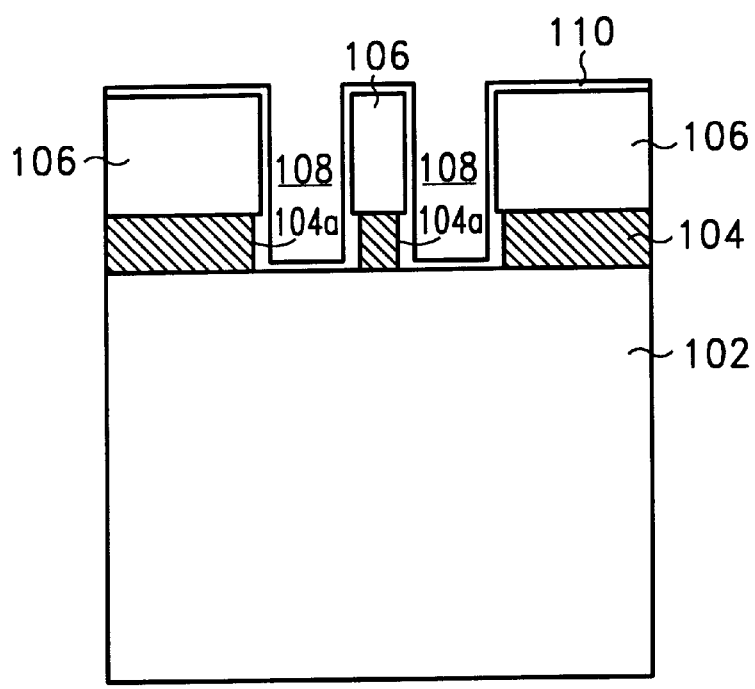
FIG. 6 is a cross sectional view of a semiconductor wafer illustrating the steps of forming a sacrificial layer on the substrate in accordance with the present invention.

Refer to FIG. 6, after the openings 108 are formed, an etching back step is performed to etch the nitride layer 104 to pull back the sidewalls 104a of the nitride layer 104, by using the oxide layer 106 as an etching mask. In a preferred embodiment, the nitride layer 104 is wet etched back by using the $H_3PO_4$, and the sidewalls 104a are pulled back about 100 to 200 angstroms. Next, a sacrificial layer 110 is formed on the surfaces of the substrate 102, the nitride layer 104 and the oxide layer 106. The sacrificial layer 110 preferably made of an thin oxide layer with a thickness about 100 to 250 angstroms, can be formed by using chemical vapor deposition (CVD) process, using TEOS as a source at a temperature between about 600 to 800° C., at a pressure 0.1 to 10 torrs.

Figure 7:
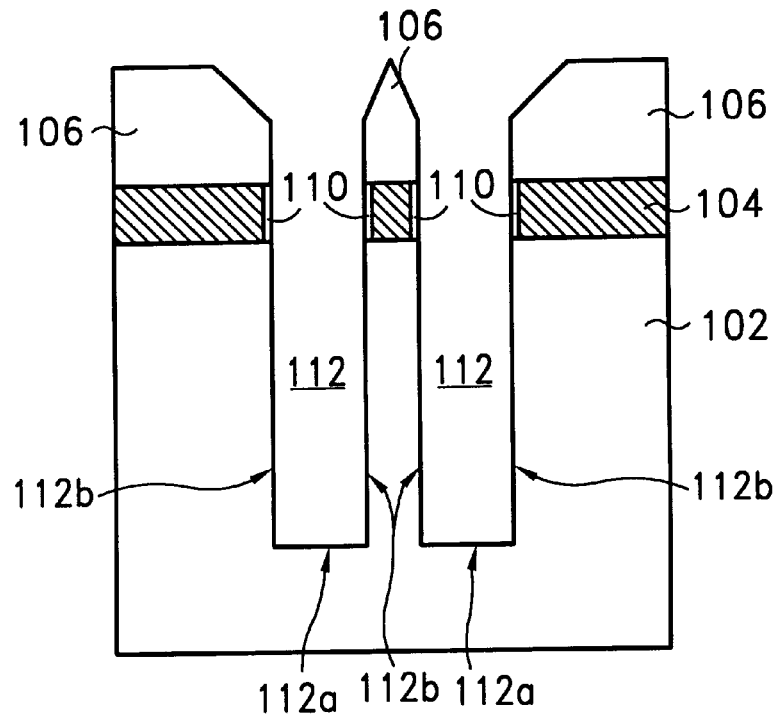
FIG. 7 is a cross sectional view of a semiconductor wafer illustrating the steps of forming the trench structures on the substrate in accordance with the present invention.

Subsequently, as illustrated in FIG. 7, an etching step is performed to etch the substrate 102 by using the oxide layer 106 as an etching mask, to form the trench structures 112 in the substrate 102. The trench structures 112 have bottoms 112a and sidewalls 112b adjacent to the bottoms 112a. In a preferred embodiment, a reactive ion etching (RIE) step is used to form the trench structures 112, and the etchant used in this step can chosen from the group of $SiCl_4/Cl_2$, $BCl_3/Cl_2$, $HBr/Cl_2/O_2$, $HBr/O_2$, $Br_2/SF_6$ and $SF_6$. It is noted that the probability of eroding the nitride layer 104 in forming the trench structures 112 is lowered, due to the nitride layer 104 has pull-back sidewalls 104a on which formed the sacrificial layer 110. Even the cycle time of etching the substrate 102 is elongated for promoting the surface of the capacitor manufactured, the probability to etching the nitride layer 104 directly is still lower. Thus, the damage of contaminated particles due to eroding the nitride layer 104 is decreased effectively.

Figure 8:
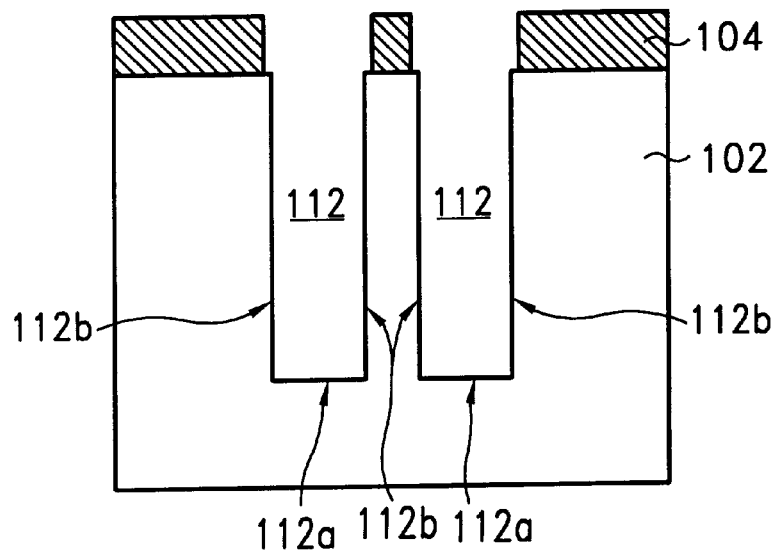
FIG. 8 is a cross sectional view of a semiconductor wafer illustrating the steps of removing the oxide layer and the sacrificial layer in accordance with the present invention.
Figure 9:
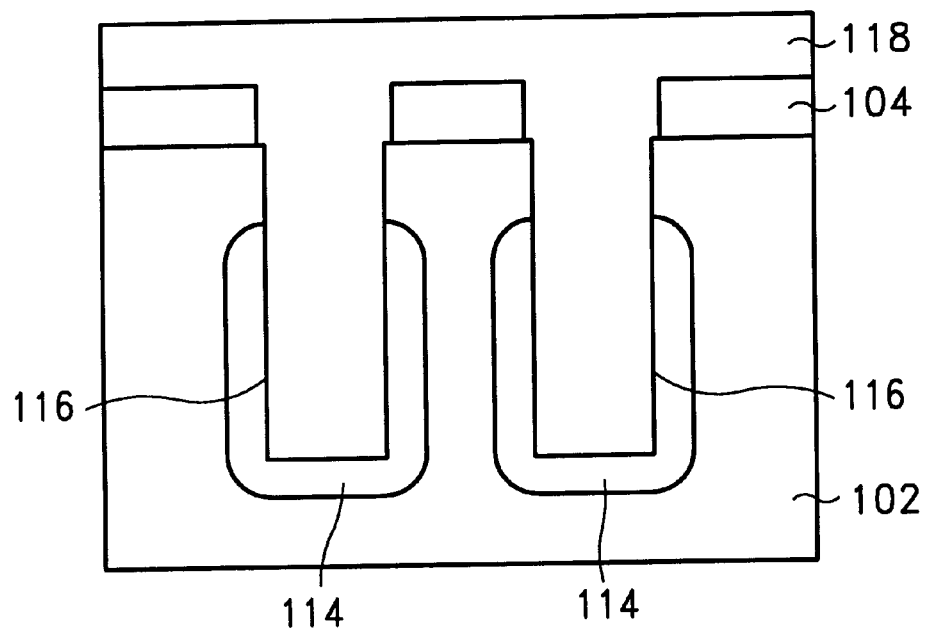
FIG. 9 is a cross sectional view of a semiconductor wafer illustrating the steps of performing a doping step for doping the trench structures in accordance with the present invention.

Then, as shown in FIG. 8, the oxide layer 106 and the sacrificial layer 110 are removed. In a preferred embodiment, the oxide layer 106 and the sacrificial layer 110 are removed by using diluted HF solution, buffer oxide etching (BOE) solution, or other similar solutions. Next, refer to FIG. 9, a doping step is performed to dope the bottoms 112a and the portions of the sidewalls 112b in the trench structures 112 to form the doped regions 114. The doped regions 114 are used to serve as the first storage electrodes of the capacitors formed in latter steps. Typically, the dopants, such as arsenic and phosphorus, are used to dope the trench structures 112 for forming the n type doped region 114. Then, capacitor dielectric films 116 are formed on the doped regions 114. The capacitor dielectric films 116 are preferably formed of either a double film of nitride/oxide film, a triple film of oxide/nitride/oxide, or any other high dielectric film such as tantalum oxide ($Ta_2O_5$), BST, PZT, PLZT, etc. A conducting layer 118 is then formed on the substrate 102 and filled into the trench structures 112. In general, The conducting layer 118 is formed of doped polysilicon, in-situ doped polysilicon, aluminum, copper, tungsten, titanium or alloy.

Figure 10:
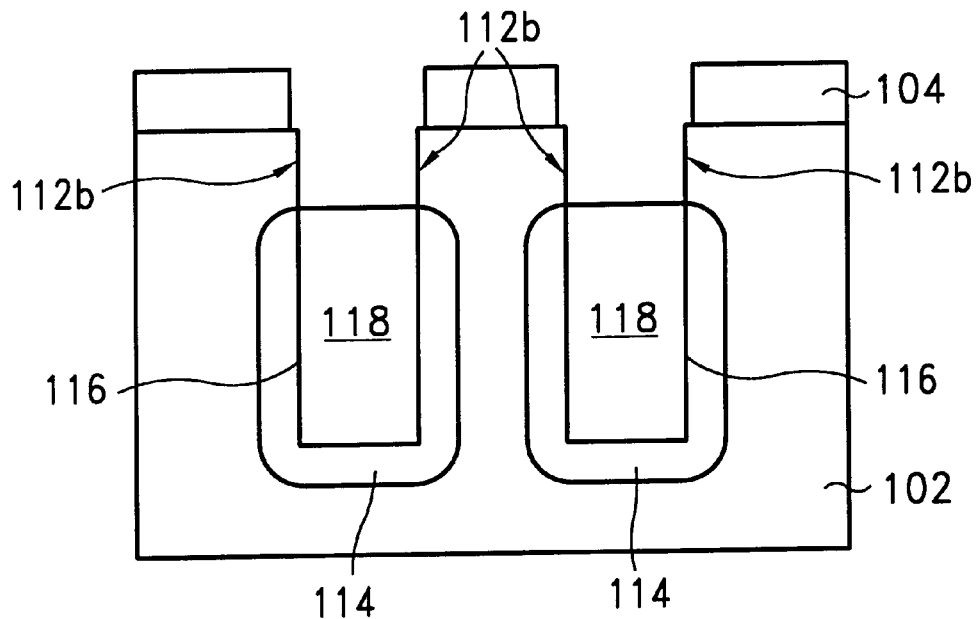
FIG. 10 is a cross sectional view of a semiconductor wafer illustrating the steps of forming a conducting layer in the trench structures in accordance with the present invention.

Next, refer to FIG. 10, an etching back step is performed to remove the conducting layer 118 above the substrate 102, wherein the nitride layer 104 is used to serve as the stopper for the etching step. The residual conducting layer 118 in the trench structures 112 is used to serve as the second storage electrodes of the capacitors.

Figure 11:
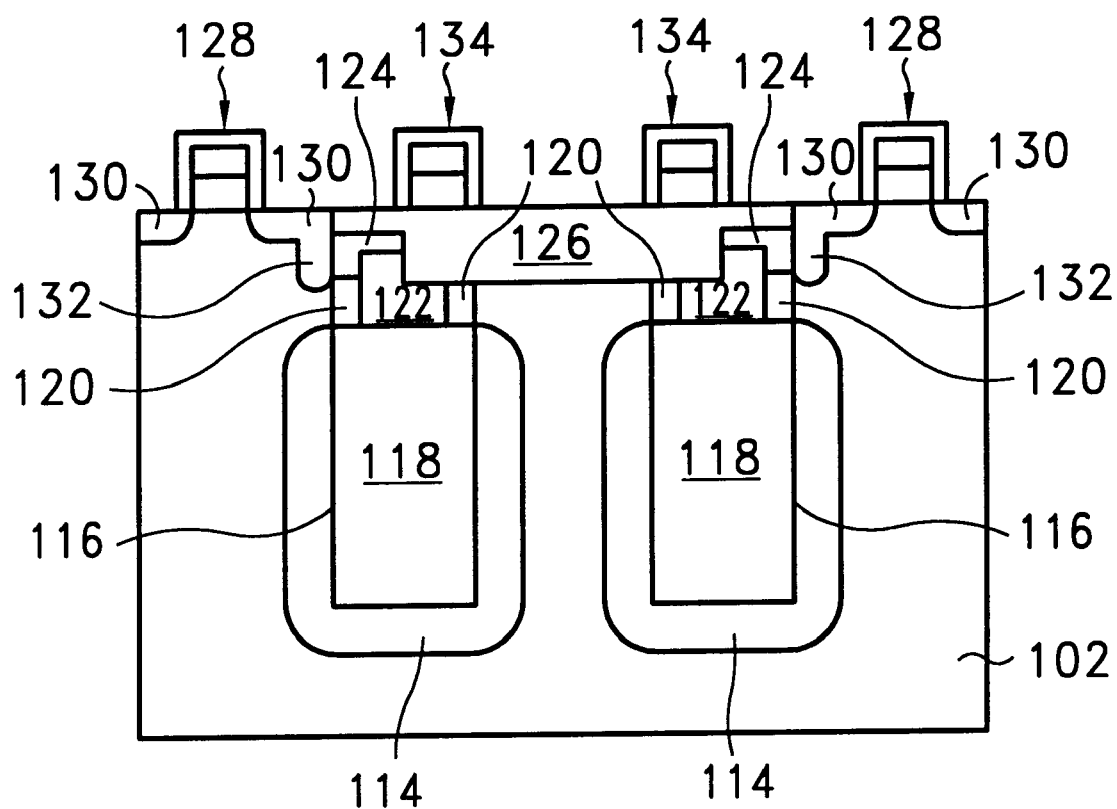
FIG. 11 is a cross sectional view of a semiconductor wafer illustrating the steps of forming the DRAM cell with the trench structures in accordance with the present invention.

Next, refer to FIG. 11, the collar oxide layers 120, a second conducting layer 122 and polysilicon layer 124 are formed on substrate 102 in sequence. A reactive ion etching (RIE) step is then used to etch the second conducting layer 122 in the trench structures 112. After the RIE step is performed, the surface of the second conducting layer 122 is below the surface of the substrate 102. Then, a wet etching step is performed to remove portions of the collar oxide layers 120. The surfaces of the collar oxide layers 120 are below the surface of the second conducting layer 122. Subsequently, a polysilicon layer 124 is formed above the second conducting layer 122 and the collar oxide layers 120, and filled into the trench structures 112. Usually, a thermal anneal step in latter steps is used to diffuse the dopants in the second conducting layer 122 into the polysilicon layer 124 and cause the polysilicon layer 124 with conductivity. Besides, the polysilicon layer 124 can also formed of doped polysilicon or in-situ doped polysilicon.

Then, a shallow trench insulator (STI) structure 126 is formed on the substrate 102 by using the well-known techniques, in order to define the active area on the substrate 102. It is noted that the STI structure 126 covered above the second conducting layer 122 and the polysilicon layer 124 in order to insulate the storage electrode and the wordlines formed in latter steps. Then, the gates 128 and the wordlines 134 are formed on the substrate 102 in sequence by using the well known art. Next, a doping step is performed to form the drain/source (D/S) structures 130 by using the gates 128 as masks. The strap regions 132 are formed in the substrate 102 to connect electrically the polysilicon layer 124 and the D/S structures 130. In a preferred embodiment, a thermal anneal step is performed to diffuse the dopants in the polysilicon layer 124 for forming the strap regions 132 as shown in FIG. 11.

The method provided in the present invention has various advantages. It is effective to prevent the nitride layer suffering erosion and the contaminated particles occurring on the surface of the substrate in forming the trench structures, by pulling back the sidewalls of the nitride layer firstly and forming a sacrificial layer to cover the sidewalls of the nitride layer. Accordingly, the probability of eroding the nitride layer and the probability of contaminated particles, such as black silicon, occurring on the surface of the substrate are both decreased. Besides, the cycle time of etching the substrate is elongated effectively to form the deeper trench structures for increasing the surface of the capacitor. Accordingly, the operating performance, storage capacity and yield of the capacitor manufactured are all promoted.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a trench structure over a semiconductor substrate, said method comprises the following steps of:

forming a nitride layer on said substrate;

forming an oxide layer above said nitride layer;

etching said nitride layer and said oxide layer to expose a portion of a surface of said substrate, and to define a pattern of said trench structure;

performing an etching back step to pull back sidewalls of said nitride layer by using said oxide layer as an etching mask;

forming a sacrificial layer above said oxide layer, said nitride layer and said substrate; and performing an etching step to etch said substrate to form said trench structure in said substrate by using said oxide layer as an etching mask, wherein said trench structure has a bottom and sidewalls adjacent to said bottom.

2. The method of claim 1, wherein said sacrificial layer is formed of a TEOS oxide layer.

3. The method of claim 1, wherein said sacrificial layer has a thickness about 100 to 250 angstroms.

4. The method of claim 1, wherein said nitride layer has a thickness about 500 to 2500 angstroms.

5. The method of claim 1, wherein said etching back step for said nitride layer is performed by using the $H_3PO_4$ solution.

6. The method of claim 1, wherein said sidewalls of said nitride layer are pulled back about 100 to 200 angstroms.

7. The method of claim 1, wherein said etching step for etching said substrate is performed by using a reactive ion etching (RIE) method.

8. The method of claim 1, wherein said substrate is formed of silicon.

9. A method of forming a trench capacitor for a DRAM cell over a semiconductor substrate, said method comprises the following steps of:

forming a nitride layer on said substrate;

forming an oxide layer above said nitride layer to serve as an etching mask;

etching said nitride layer and said oxide layer to expose a portion of a surface of said substrate;

performing an etching back step to pull back sidewalls of said nitride layer by using said oxide layer as an etching mask;

forming a sacrificial layer above said oxide layer, said nitride layer and said substrate;

performing an etching step to etch said substrate to form said trench structures in said substrate by using said oxide layer as an etching mask, wherein said trench structure has a bottom and sidewalls adjacent to said bottom;

removing said oxide layer and said sacrificial layer;

performing a doping step to form a doped region on said bottom and a portion of said sidewalls adjacent to said bottom in said trench structure;

forming a dielectric layer above said doped region; and forming a conducting layer to fill into said trench structure, wherein said conduction layer is coupled with a drain structure electrically.

10. The method of claim 9, wherein said sacrificial layer is formed of a TEOS oxide layer.

11. The method of claim 9, wherein said sacrificial layer has a thickness about 100 to 250 angstroms.

12. The method of claim 9, wherein said etching back step for said nitride layer is performed by using the $H_3PO_4$ solution.

13. The method of claim 9, wherein said sidewalls of said nitride layer is pulled back about 100 to 200 angstroms.

14. The method of claim 9, wherein said oxide layer and said sacrificial layer are removed by using the solution chosen from the group of HF solution and buffer oxide etching (BOE) solution.

15. The method of claim 9, wherein said dielectric layer is chosen from a group of O/N, O/N/O, $Ta_2O_5$, BST, PZT.

16. The method of claim 9, wherein said conducting layer is selected from the group of doped polysilicon, in-situ doped polysilicon, aluminum, copper, tungsten, titanium, and alloy combinations thereon.

17. A method of forming a trench capacitor for a DRAM cell over a semiconductor substrate, said method comprises the following steps of:

forming a nitride layer on said substrate;

forming a first oxide layer above said nitride layer to serve as an etching mask;

etching said nitride layer and said first oxide layer to expose a portion of a surface of said substrate;

performing an etching back step to pull back sidewalls of said nitride layer with a thickness about 100 to 200 angstroms by using said first oxide layer as an etching mask;

forming a second oxide layer with a thickness about 100 to 250 angstroms above said first oxide layer, said nitride layer and said substrate;

performing an etching step to etch said substrate to form said trench structures in said substrate by using said first oxide layer as an etching mask, wherein said trench structure has a bottom and sidewalls adjacent to said bottom, removing said first oxide layer and said second oxide layer by a wet etching step;

performing a doping step to form a doped region on said bottom and a portion of said sidewalls adjacent to said bottom in said trench structure;

forming a dielectric layer above said doped region; and forming a conducting layer to fill into said trench structure, wherein said conduction layer is coupled with a drain structure electrically.

18. The method of claim 17, wherein said second oxide layer is formed of a TEOS oxide layer.

19. The method of claim 17, wherein said etching back step for said nitride layer is performed by using the $H_3PO_4$ solution.

20. The method of claim 17, wherein said oxide layer and said sacrificial layer are removed by using the solution chosen from the group of HF solution and buffer oxide etching (BOE) solution.

* * * * *